United States Patent
Jung

(10) Patent No.: US 7,848,168 B2
(45) Date of Patent: Dec. 7, 2010

(54) SEMICONDUCTOR MEMORY DEVICE HAVING REFRESH MODE AND METHOD FOR DRIVING THE SAME

(75) Inventor: Hun-Sam Jung, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 175 days.

(21) Appl. No.: 12/164,044

(22) Filed: Jun. 28, 2008

(65) Prior Publication Data
US 2009/0003094 A1 Jan. 1, 2009

(30) Foreign Application Priority Data
Jun. 29, 2007 (KR) ...................... 10-2007-0065414

(51) Int. Cl.
*G11C 7/00* (2006.01)
*G11C 8/08* (2006.01)
(52) U.S. Cl. .............. 365/222; 365/230.06; 365/230.09
(58) Field of Classification Search ................. 365/222, 365/230.06, 230.09, 236
See application file for complete search history.

(56) References Cited

U.S. PATENT DOCUMENTS 6,507,532 B1 * 1/2003 Fujino et al. ........... 365/230.03
7,248,525 B2 * 7/2007 Sato et al. .................... 365/222
2002/0191467 A1 * 12/2002 Matsumoto et al. ......... 365/222
2007/0086266 A1 * 4/2007 Freebern et al. ........ 365/230.08

FOREIGN PATENT DOCUMENTS

| JP | 2002-203389 | 7/2002 |
|---|---|---|
| KR | 1993-0024012 | 12/1993 |
| KR | 10-0276386 | 9/2000 |
| KR | 2004-0079748 | 9/2004 |

* cited by examiner

*Primary Examiner*—Hoai V Ho
*Assistant Examiner*—James G Norman
(74) *Attorney, Agent, or Firm*—IP & T Group LLP

(57) ABSTRACT

A semiconductor memory device can control the toggling of signals corresponding to internal addresses during an auto-refresh mode. The semiconductor memory device includes an internal address generator configured to generate a plurality of first word line driving information signals and a plurality of first to seventh address information signals, which are sequentially activated in response to a driving signal and a refresh signal, a toggle controller configured to generate first and second toggle control signals in response to the third to sixth address information signals during an auto-refresh mode or a self-refresh mode, and a driving controller configured to generate a plurality of bit line driving signals and a plurality of second word line driving information signals corresponding to the first to third and seventh address information signals in response to the first and second toggle control signals.

24 Claims, 15 Drawing Sheets

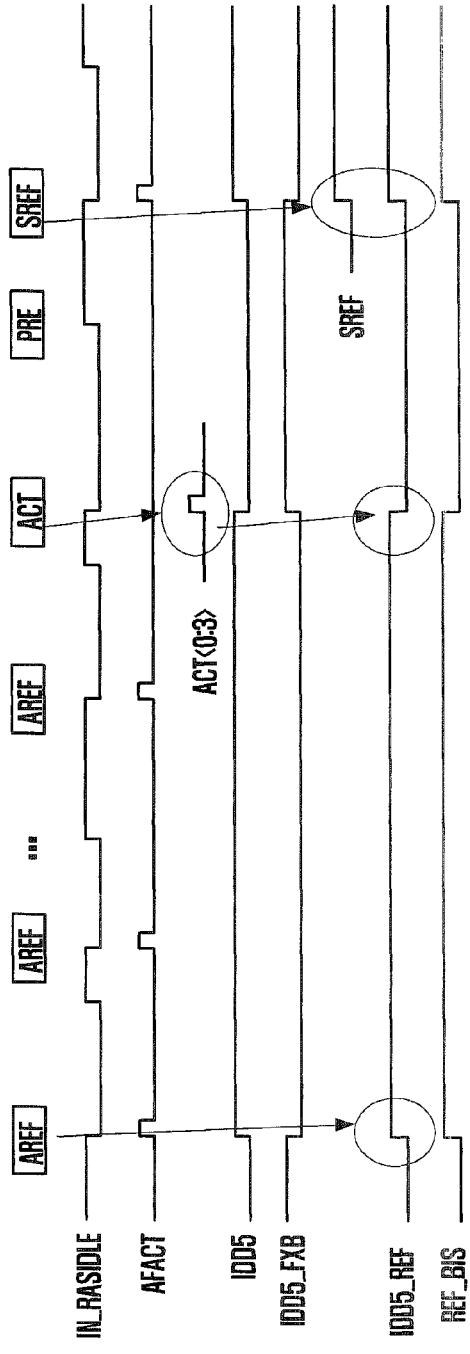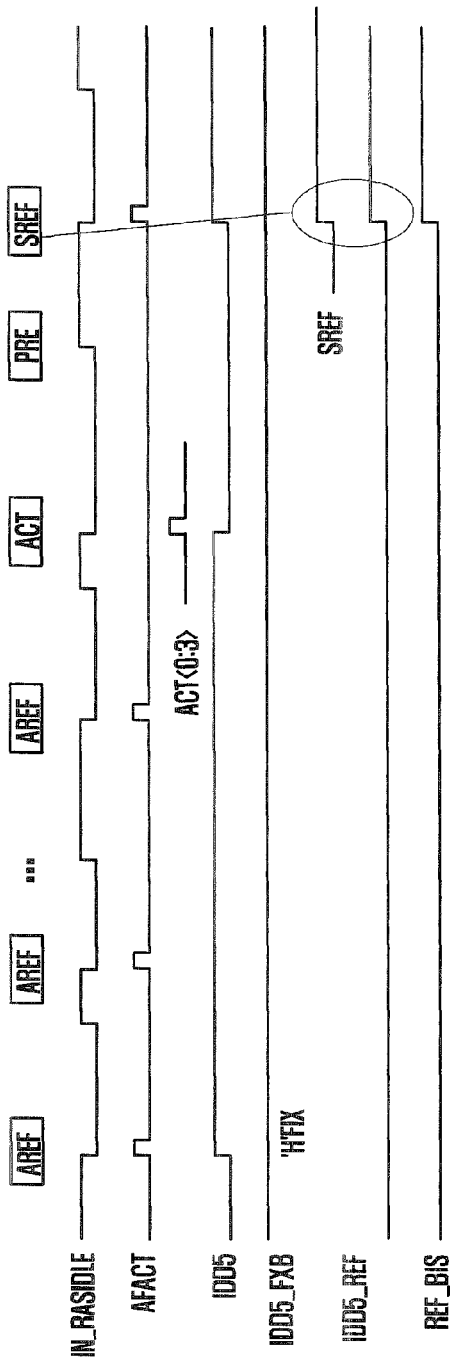

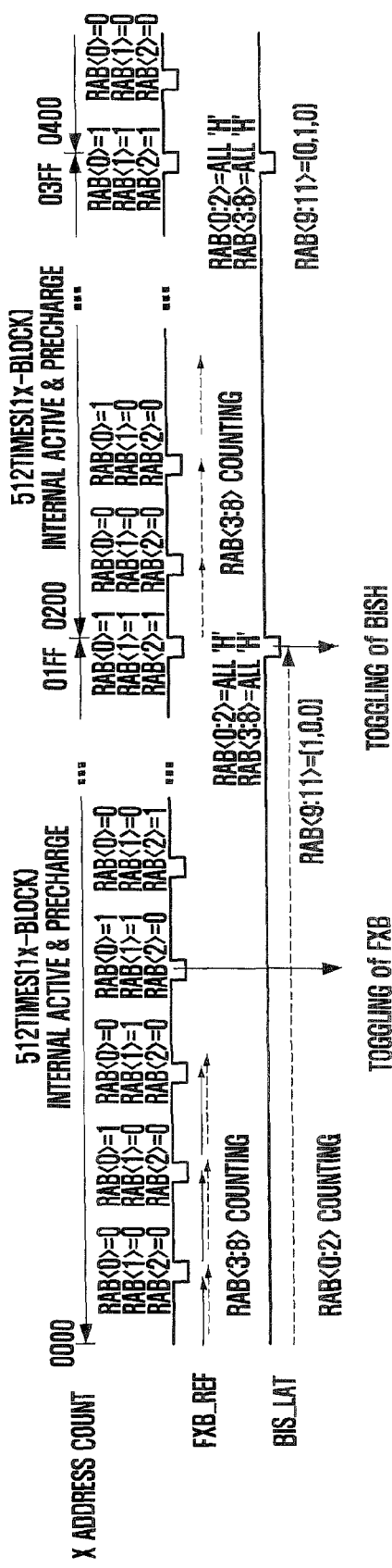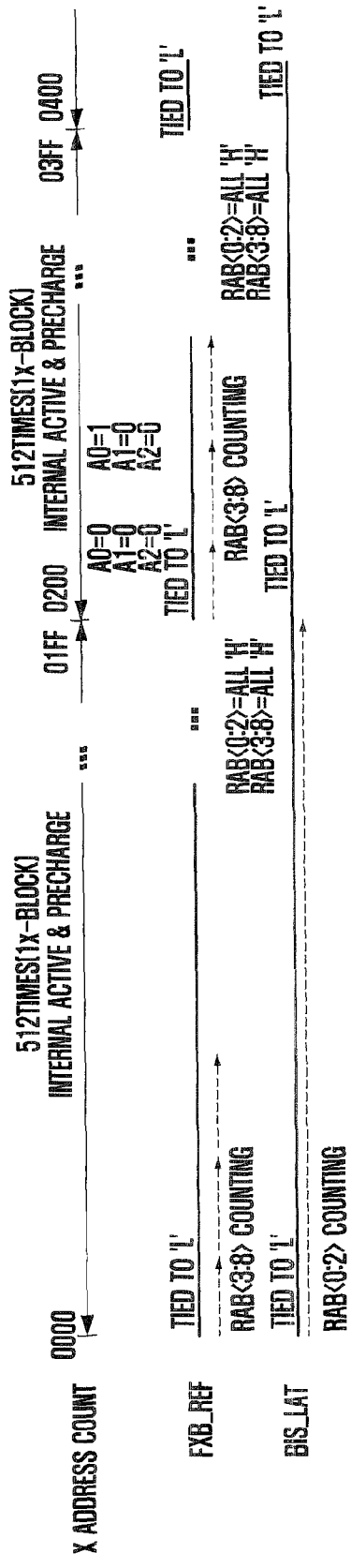
FIG. 14A
FIG. 14B

SEMICONDUCTOR MEMORY DEVICE HAVING REFRESH MODE AND METHOD FOR DRIVING THE SAME

CROSS-REFERENCE TO RELATED APPLICATIONS

The present invention claims priority to Korean patent application number 10-2007-0065414, filed on Jun. 29, 2007, which is incorporated by reference in its entirety.

BACKGROUND OF THE INVENTION

The present invention relates to a semiconductor memory device, and more particularly to an address counting block for a refresh mode of the semiconductor memory device.

A dynamic random access memory (DRAM) periodically performs a refresh operation to retain data. The refresh operation may be classified into an auto-refresh operation and a self-refresh operation. The auto-refresh operation and the self-refresh operation are identical to each other in that an address is internally generated, without any external application, but they are different from each other in view of refresh interval and period, application of an external command, and so on. The auto-refresh operation is rapidly performed because an auto-refresh command AREF is externally applied at a short period of, for example, a few tens ns. On the other hand, the self-refresh operation is relatively slowly performed because commands (SREF, SREX) indicating the beginning and end of the self-refresh are applied at a relatively long period of, for example, a few µs.

FIG. 1 is a block diagram of a conventional semiconductor memory device with an address counting block for a refresh mode.

Referring to FIG. 1, the conventional semiconductor memory device includes an internal address generator 10, a driving controller 20, and a core region 30. The internal address generator 10 generates a plurality of word line driving information signals MWLB<0:63> and a plurality of address information signals AX01<0:3>, AX<20>, AX<21> and MSB<0:7>, which are sequentially activated in response to a driving signal EN_RAB12 and a refresh signal REF. The driving controller 20 receives the plurality of address information signals AX01<0:3>, AX<20>, AX<21> and MSB<0:7> to generate a bit line driving signal BISHLB and word line driving information signals FXB<0:7>. The core region 30 accesses a corresponding cell in response to the bit line driving signal BISHLB and the word line driving information signals FXB<0:7>.

The internal address generator 10 includes an address counting unit 12 and a decoding unit 14. The address counting unit 12 counts internal addresses RAB<0:11> in sequence 1 bit by 1 bit in response to the driving signal EN_RAB12 and the refresh signal REF. The decoding unit 14 decodes the internal addresses RAB<0:11> to generate the plurality of word line driving information signals MWLB<0:63> and the plurality of address information signals AX01<0:3>, AX<20>, AX<21> and MSB<0:7>.

FIG. 2 is a circuit diagram of the address counting unit 12 illustrated in FIG. 1.

Referring to FIG. 2, the address counting unit 12 includes eleven 1-bit unit counters and a 1-bit unit counter, which are connected in series. The eleven 1-bit unit counters are configured to be activated in response to the refresh signal REF, and the 1-bit unit counter is configured to be activated in response to the driving signal EN_RAB12 and the refresh signal REF.

The internal addresses change in order from RAB<3> to RAB<8>, from RAB<0> to RAB<2>, and from RAB<9> to RAB<11> according to the application of the refresh signal REF and the driving voltage EN_RAB12. The order of the internal addresses RAB<0:11> may be changed according to the arrangement of the unit counters.

The semiconductor memory device uses internal addresses in the refresh operation, instead of external addresses. In other words, the refresh operation is performed using the internal (row) addresses RAB<0:11>, which are generated by the address counting unit 12 and increased 1 bit by 1 bit. The internal (row) addresses RAB<0:11> have a constant pattern during the refresh operation and thus the DRAM can estimate them. For reference, since external addresses inputted together with an active command have a random characteristic, the DRAM cannot estimate them.

FIG. 3 is a timing diagram illustrating the operation of the conventional semiconductor memory device of FIGS. 1 and 2.

Referring to FIG. 3, the refresh signal REF is activated whenever the auto-refresh command AREF is inputted. The address counting unit 12 is enabled in response to the driving signal EN_RAB12 and the refresh signal REF and increases the internal addresses RAB<0:11> 1 bit by 1 bit.

The decoding unit 14 decodes upper three bits RAB<9:11> of the internal addresses to generate the plurality of address information signals MSB<0:7>, decodes next six bits RAB<3:8> to generate the plurality of word line driving information signals MWLB<0:63>, and decodes the remaining 3 bits RAB<0:2> to generate the plurality of address information signals AX01<0:3>, AX<20> and AX<21>.

The driving controller 20 receives the plurality of address information signals AX01<0:3>, AX<20>, AX<21> and MSB<0:7> to generate the bit line driving signal BISHLB and the word line driving information signals FXB<0:7>.

The core region 30 selects cells corresponding to the word line driving information signals MWLB<0:63> and FXB<0:7> and transfers data of the selected cells in response to the bit line driving signal BISHLB.

In this way, the internal addresses RAB<0:11> are counted and increased 1 bit by 1 bit in response to the activation and precharge of the banks during the auto-refresh operation. Further, the internal addresses RAB<0:11> are decoded, and the word line driving information signals MWLB<0:63> and FXB<0:7>L and the bit line driving signal BISHLB are toggled. The toggling of each signal is generated only one time in order to apply the corresponding signal by decoding the internal addresses RAB<0:11> generated by the activation of the bank. All the signals are toggled to logic high level to initialize the addresses in the precharge operation.

When the auto-refresh command AREF is inputted, the memory is accessed by increasing the internal addresses RAB<0:11> 1 bit by 1 bit. As the internal addresses increase, the word line driving information signals change in order of MWLB<0>→MWLB<1>→MWLB<2>→MWLB<3>→ . . . →MWLB<63>, and then the word line driving information signals change in order of FXB<0>→FXB<1>→FXB<2>→FXB<3>→FXB<4>→FXB<5>→FXB<6>→FXB<7>. Then, the bit line driving signals change in order of BISHLB<0>→BISHLB<1>→BISHLB<2>→BISHLB<3>→BISHLB<4>→BISHLB<5>→BISHLB<6>→BISHLB<7>.

As illustrated in FIG. 3, the bits RAB<2:0> of the internal addresses do not change even though the fourth auto-refresh command AREF is inputted and thus the internal addresses RAB<0:11> are counted. Therefore, it can be seen that the word line driving information signal FXB<0> generated by decoding the bits RAB<2:0> of the internal addresses maintains a logic low level. Further, since the internal addresses RAB<11:9> does not change during the counting operation, the bit line driving signal BISHLB<0> generated by the internal addresses RAB<11:9> maintain a constant level. On the other hand, the levels of the internal addresses RAB<3:8> change as the address counting unit 12 is driven. Therefore, the word line driving information signals generated by decoding the internal addresses RAB<3:8> change in order of MWLB<0>→MWLB<1>→MWLB<2>→MWLB<3>....

Although the levels of the word line driving information signal FXB<0> and the bit line driving signal BISHLB<0> do not change during a specific auto-refresh operation, the word line driving information signal FXB<0> and the bit line driving signal BISHLB<0> are toggled in every activation timing and precharge timing. This is because the decoding and resetting of the internal addresses RAB<0:11> are repeated in every activation and precharge.

Thus, a current is unnecessarily consumed by the toggling, although the word line driving information signal FXB<0> and the bit line driving signal BISHLB<0> have the constant levels during the refresh operation.

Meanwhile, to reduce the unnecessary current consumption caused by the toggling during the self-refresh mode, the semiconductor memory device prevents the toggling of the signal when the logic level of the corresponding signal does not change. For example, if unnecessary, the semiconductor memory device prevents the toggling of the word line driving information signals FXB<0:7> or the bit line driving signal BISHLB. If necessary, the semiconductor memory device allows the toggling, for example, when the internal addresses RAB<0:2> or the internal addresses RAB<9:11> are toggled. That is, the semiconductor memory device prevents or allows the toggling, depending on whether the internal addresses RAB<0:11> change or not.

However, the above operation in the self-refresh mode cannot be applied during the auto-refresh mode. This is because the beginning and end of the self-refresh mode are easy to be defined using the external command, but the beginning and end of the auto-refresh mode are difficult to be defined because there is no specific external command indicating them.

SUMMARY OF THE INVENTION

Embodiments of the present invention are directed to providing a semiconductor memory device that can control the toggling of signals corresponding to internal addresses during an auto-refresh mode.

In one embodiment, a semiconductor memory device includes an internal address generator configured to generate a plurality of first word line driving information signals and a plurality of first to seventh address information signals, which are sequentially activated in response to a driving signal and a refresh signal, a toggle controller configured to generate first and second toggle control signals in response to the third to sixth address information signals during an auto-refresh mode or a self-refresh mode, a driving controller configured to generate a plurality of bit line driving signals and a plurality of second word line driving information signals corresponding to the first to third and seventh address information signals in response to the first and second toggle control signals, and a core region configured to access cells in response to the bit line driving signals and the first and second word line driving information signals.

In another embodiment, a method for driving a semiconductor memory device includes sequentially increasing an internal address in an auto-refresh mode, and maintaining an internal driving signal generated by a part of bits of the internal address at a constant level when the part of the bits of the internal address has a constant value.

BRIEF DESCRIPTION OF THE DRAWINGS

FIG. 7A is a timing diagram illustrating an operation of a refresh period detecting unit when a fuse option is cut.

FIG. 7B is a timing diagram illustrating an operation of the refresh period detecting unit when the fuse option is uncut.

FIG. 14A is a timing diagram illustrating the level variation of first and second toggle control signals according to the counting of the internal addresses.

FIG. 14B is a timing diagram illustrating the level variation of the internal addresses and the deactivation of the first and second toggle control signals.

DESCRIPTION OF SPECIFIC EMBODIMENTS

Hereinafter, a semiconductor memory device in accordance with the present invention will be described in detail with reference to the accompanying drawings.

Figure 4:
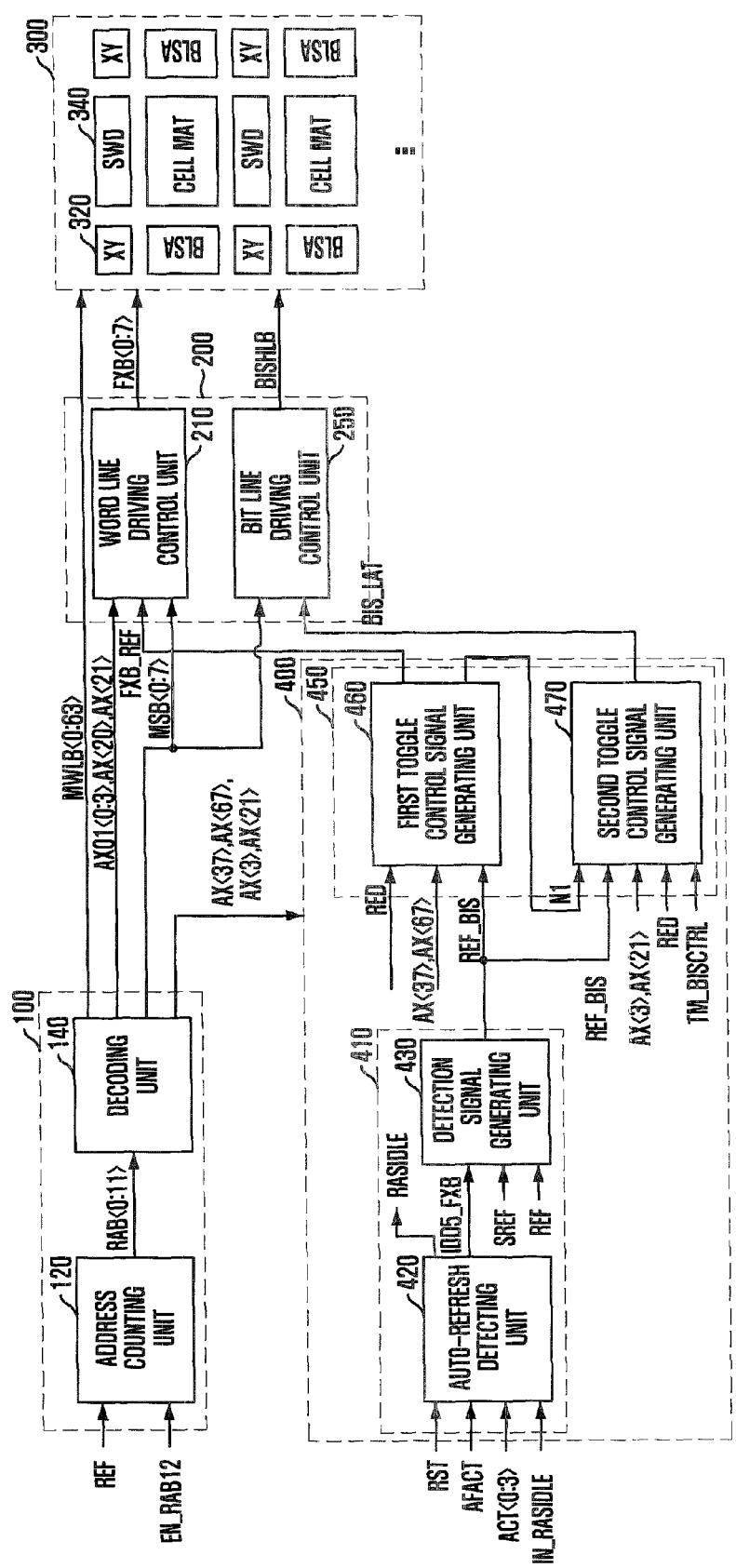
FIG. 4 is a block diagram of a semiconductor memory device in accordance with an embodiment of the present invention.

FIG. 4 is a block diagram of a semiconductor memory device in accordance with an embodiment of the present invention.

Referring to FIG. 4, the semiconductor memory device includes an internal address generator 100, a driving controller 200, a core region 300, and a toggle controller 400. The internal address generator 100 generates word line driving information signals MWLB<0:63> and address information signals AX01<0:3>, AX<20>, AX<37>, AX<67>, AX<3>, AX<21> and MSB<0:7>, which are sequentially activated in response to a driving signal EN_RAB12 and a refresh signal REF. The toggle controller 400 generates toggle control signals FXB_REF and BIS_LAT in response to the address information signals AX<37>, AX<67>, AX<3> and AX<21> in an auto-refresh mode and a self-refresh mode. The driving controller 200 receives the address information signals AX01<0:3>, AX<20>, AX<21> and MSB<0:7> to generate a bit line driving signal BISHLB and word line driving information signals FXB<0:7> in response to the toggle control signals FXB_REF and BIS_LAT. The core region 300 accesses corresponding cells in response to the bit line driving signal BISHLB, the word line driving information signals MWLB<0:63> and FXB<0:7>.

The driving controller 200 includes a word line driving control unit 210 and a bit line driving control unit 250. The word line driving control unit 220 receives the plurality of address information signals AX01<0:3>, AX<20>, AX<21> and MSB<0:7> to generate the word line driving information signals FXB<0:7> in response to the first toggle control signal FXB_REF. The bit line driving control unit 250 receives the plurality of address information signals MSB<0:7> to generate the bit line driving signal BISHLB in response to the second toggle control signal BIS_LAT.

The toggle controller 400 includes a refresh period detecting unit 410 and a toggle control signal generating unit 450. The refresh period detecting unit 410 receives an auto-refresh signal AFACT, bank active signals ACT<0:3>, an idle signal IN_RASIDLE, a self-refresh signal SREF, and a refresh signal REF to generate a mode detection signal REF_BIS indicating the self-refresh mode and the auto-refresh mode. The toggle control signal generating unit 450 receives the mode detection signal REF_BIS, the plurality of address information signals AX<37>, AX<67>, AX<3> and AX<21>, and a test signal TM_BISCTRL to generate the first and second toggle control signals FXB_REF and BIS_LAT.

The refresh period detecting unit 410 includes an auto-refresh detecting unit 420 and a detection signal generating unit 430. The auto-refresh detecting unit 420 receives the auto-refresh signal AFACT, the bank active signal ACT<0:3>, and the idle signal IN_RASIDLE to generate an auto-refresh mode signal IDD5_FXB indicating the auto-refresh mode. The detection signal generating unit 430 receives the auto-refresh mode signal IDD5_FXB, the self-refresh signal SREF, and the refresh signal REF to generate the mode detection signal REF_BIS indicating the refresh mode.

The toggle control signal generating unit 450 includes a first toggle control signal generating unit 460 and a second toggle control signal generating unit 470. The first toggle control signal generating unit 460 receives the mode detection signal REF_BIS, the plurality of address information signals AX<37> and AX<67>, and a defective cell repair signal RED to generate the first toggle control signal FXB_REF for controlling the toggling of the word line driving information signals FXB<0:7>. The second toggle control signal generating unit 470 receives the mode detection signal REF_BIS, the address information signals AX<3> and AX<21>, the test signal TM_BISCTRL, and the defective cell repair signal RED to generate the second toggle control signal BIS_LAT for controlling the toggling of the bit line driving signal BISHLB.

The core region 300 includes a sub hole 320, a sub word line driving unit 340, a cell mat, and a bit line sense amplifying unit (BLSA). The sub hole 320 receives the word line driving information signals FXB<0:7> to generate the positive/negative word line driving information signals FXB<0:7> and FX<0:7>, and receives the bit line driving signal BISHLB to generate a bit line separation signal BISHL. The sub word line driving unit 340 generates a sub word line driving signal SWL in response to the word line driving information signals FXB<0:7>, FX<0:7> and MWLB<0:63>. The cell mat reads or store data of cells corresponding to the sub word line driving signal SWL. The bit line sense amplifying unit senses and amplifies data of the cell mat in response to the bit line separation signal BISHL.

In this way, the toggle controller 400 of the semiconductor memory device controls the toggling of the signals corresponding to the internal addresses in the auto-refresh mode as well as the self-refresh mode. As described above, the beginning and end of the auto-refresh mode can be defined by the toggle controller 400. Further, the current consumption caused by the unnecessary toggling can be prevented by the toggle controller 400.

Figure 5:
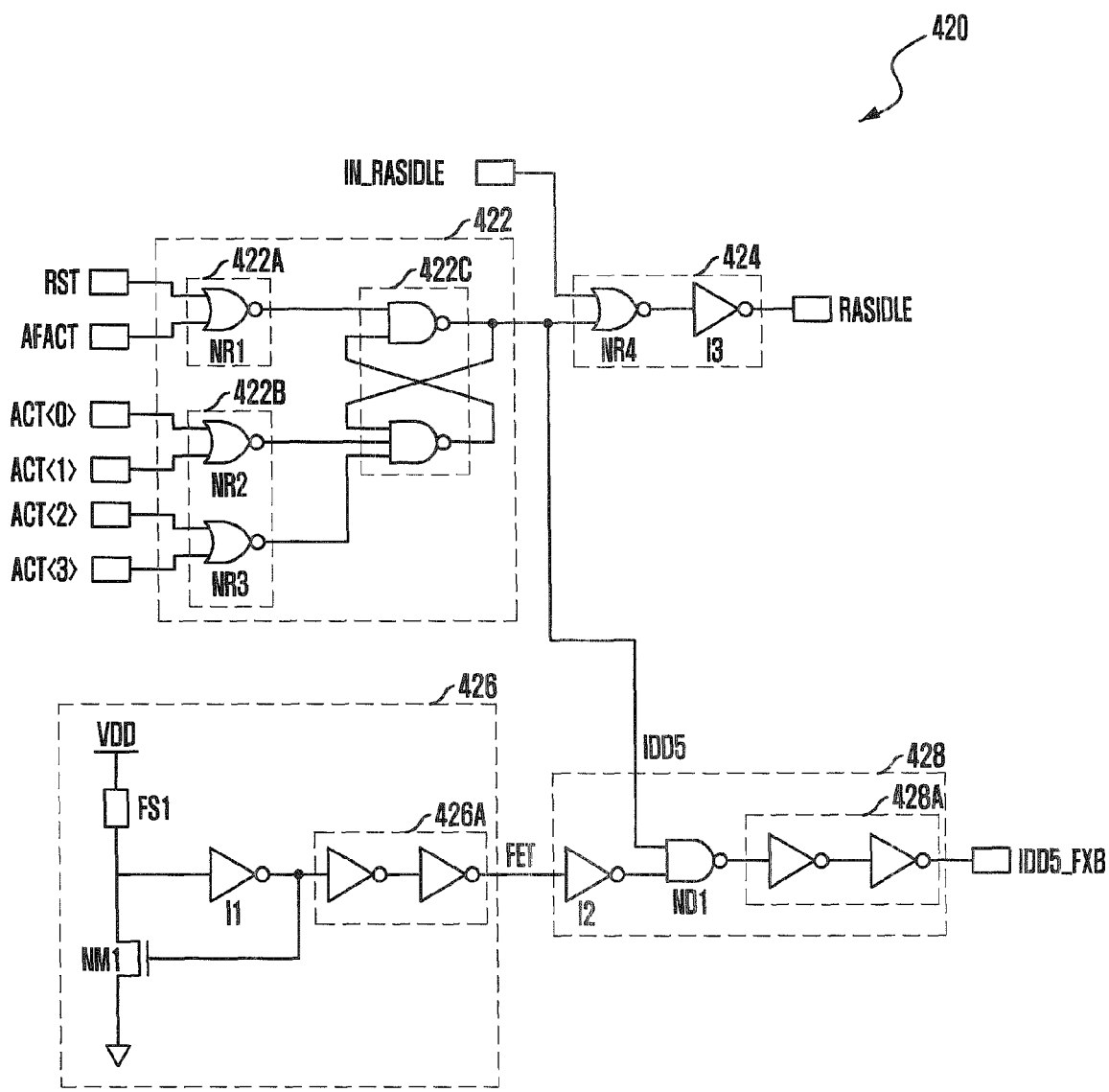
FIG. 5 is a circuit diagram of an auto-refresh detecting unit illustrated in FIG. 4.

FIG. 5 is a circuit diagram of the auto-refresh detecting unit 420 illustrated in FIG. 4.

Referring to FIG. 5, the auto-refresh detecting unit 420 includes an auto-refresh period detecting unit 422, a fuse detecting unit 426, a signal output unit 428, and an idle detecting unit 424. The auto-refresh period detecting unit 422 receives a reset signal RST, the auto-refresh signal AFACT, and the active signals ACT<0:3> to generate an auto-refresh period detection signal IDD5. The fuse detecting unit 426 generates an output control signal FET according to a fuse option FS1. The signal output unit 428 outputs the auto-refresh period detection signal IDD5 as an auto-refresh mode signal IDD5_FXB in response to the output control signal FET. The idle detecting unit 424 receives the auto-refresh period detection signal IDD5 and the idle signal IN_RASIDLE to generate an idle period detection signal RASIDLE.

The auto-refresh period detecting unit 422 includes a set signal input unit 422A, a reset signal input unit 422B, and an RS latch unit 422C. The set signal input unit 422A is configured to receive the reset signal RST and the auto-refresh signal AFACT to output an input set signal. The reset signal input unit 422B is configured to receive the plurality of active signals ACT<0:3> to output first and second input reset signals. The RS latch unit 422C is configured to activate the auto-refresh period detection signal IDD5 in response to the input set signal and deactivates it in response to the first and second input reset signals.

The set signal input unit 422A includes a first NOR gate NR1 configured to perform a logic operation on the reset RST and the auto-refresh signal AFACT to output the input set signal.

The reset signal input unit 422B includes a second NOR gate NR2 configured to perform a logic operation on the active signals ACT<0> and ACT<1> to output the first input reset signal, and a third NOR gate NR3 configured to perform a logic operation on the active signals ACT<2> and ACT<3> to output the second input reset signal.

Upon operation of the auto-refresh period detecting unit 422, the set signal input unit 422A activates the input set signal in response to the activation of the auto-refresh signal AFACT or the reset signal RST. The RS latch unit 422C activates the auto-refresh period detection signal IDD5 to a logic high level in response to the input set signal. When at least one of the active signals ACT<0:3> is activated, the reset signal input unit 422B activates the first or second input reset signal to a logic high level. The RS latch unit 422C deactivates the auto-refresh period detection signal IDD5 to a logic low level in response to the first and second input reset signals. In other words, the auto-refresh period detecting unit 422 activates the auto-refresh period detection signal IDD5 to a logic high level in response to the activation of the auto-refresh signal AFACT or the reset signal RST and deactivates it to logic low level in response to the activation of the active signals ACT<0:3>.

That is, the auto-refresh period detecting unit 422 activates the auto-refresh period detection signal IDD5 while the auto-refresh command AREF is applied for an auto-refresh mode. When the active command ACT is inputted after the auto-refresh mode, the auto-refresh period detecting unit 422 deactivates the auto-refresh period detection signal IDD5.

The fuse detecting unit 426 includes a fuse option FS1, an inverter I1, an NMOS transistor NM1, and a delay 426A. The fuse option FS1 is connected between a power supply voltage (VDD) terminal and a first node. The inverter I1 is configured to invert a voltage applied to the first node. The NMOS transistor NM1 has a gate receiving an output signal of the inverter I1, a drain connected to the first node, and a source connected to a ground voltage (VSS) terminal. The delay 426A is configured to delay the output signal of the inverter I1 to output the output control signal FET.

The fuse detecting unit 426 outputs the output control signal FET of a logic high level when the fuse option FS1 is not cut, and outputs the output control signal FET of a logic low level when the fuse option FS1 is cut.

The signal output unit 428 includes an inverter I2, a NAND gate ND1, and a delay 428A. The inverter I2 is configured to invert the output control signal FET. The NAND gate ND1 is configured to perform a NAND operation on an output signal of the inverter I2 and the auto-refresh period detection signal IDD5. The delay 428A is configured to delay an output signal of the NAND gate ND1 to output the auto-refresh mode signal IDD5_FXB.

When the output control signal FET has a logic low level, the signal output unit 428 inverts the auto-refresh period detection signal IDD5 to output the auto-refresh mode signal IDD5_FXB. When the output control signal FET has a logic high level, the signal output unit 428 deactivates the auto-refresh mode signal IDD5_FXB to a logic high level, regardless of the logic level of the auto-refresh period detection signal IDD5.

Meanwhile, the idle detecting unit 424 includes a NOR gate NR4 and an inverter I3. The NOR gate NR4 is configured to perform a NOR operation on the auto-refresh period detection signal IDD5 and the idle signal IN_RASIDLE. The inverter I3 is configured to invert an output signal of the NOR gate NR4 to output the idle period detection signal RASIDLE.

When the auto-refresh period detection signal IDD5 or the idle signal IN_RASIDLE is activated to a logic high level, the idle detecting unit 424 activates the idle period detection signal RASIDLE to a logic high level. That is, the idle detecting unit 424 indicates the idle state, i.e., non active state, mode by activating the idle period detection signal RASIDLE in the idle mode or the refresh mode.

Figure 6:
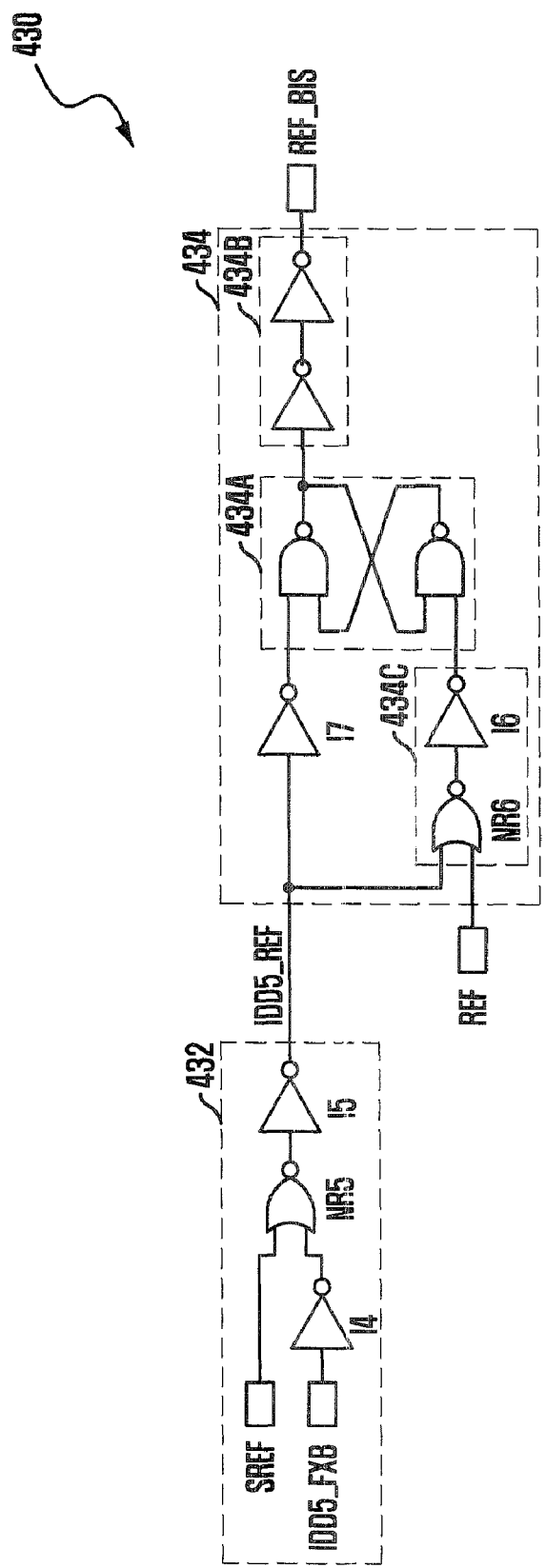
FIG. 6 is a circuit diagram of a detection signal generating unit illustrated in FIG. 4.

FIG. 6 is a circuit diagram of the detection signal generating unit 430 illustrated in FIG. 4.

Referring to FIG. 6, the detection signal generating unit 430 includes a refresh detecting unit 432 and a signal generating unit 434. The refresh detecting unit 432 outputs a pre-mode detection signal IDD5_REF in response to the activation of the auto-refresh mode signal IDD5_FXB or the self-refresh signal SREF. The signal generating unit 434 receives the pre-mode detection signal IDD5_REF and the refresh signal REF to generate the mode detection signal REF_BIS indicating the refresh mode.

The refresh detecting unit 432 includes an inverter I4, a NOR gate NR5, and an inverter I5. The inverter I4 is configured to invert the auto-refresh mode signal IDD5_FXB. The NOR gate NR5 is configured to perform a NOR operation on the self-refresh signal SREF and an output signal of the inverter I4. The inverter I5 is configured to invert an output signal of the NOR gate NR5 to output the pre-mode detection signal IDD5_REF.

The signal generating unit 434 includes an inverter I7, a NOR gate NR6, an inverter I6, an RS latch 434A, and a delay 434B. The inverter I7 is configured to invert the pre-mode detection signal IDD5_REF. The NOR gate NR6 is configured to perform a NOR operation on the pre-mode detection signal IDD5_REF and the refresh signal REF. The inverter I6 is configured to invert an output signal of the NOR gate NR6. The RS latch 434B is configured to receive an output signal of the inverter I7 as a set signal and the output signal of the inverter I6 as a reset signal. The delay 434B is configured to delay an output signal of the RS latch 434A to output the mode detection signal REF_BIS.

When the self-refresh signal SREF is activated to a logic high level or the auto-refresh mode signal IDD5_FXB is activated to a logic low level, the refresh detecting unit 432 activates the pre-mode detection signal IDD5_REF to a logic high level.

When the pre-mode detection signal IDD5_REF is activated to a logic high level, the signal generating unit 434 activates the mode detection signal REF_BIS to a logic high level. When the pre-mode detection signal IDD5_REF and the refresh signal REF have a logic low level, the signal generating unit 434 deactivates the mode detection signal REF_BIS to a logic low level.

In other words, when the self-refresh signal SREF or the auto-refresh mode signal IDD5_FXB is activated, the detection signal generating unit 430 activates the mode detection signal REF_BIS indicating the refresh mode to a logic high level. When the self-refresh signal SREF, the auto-refresh mode signal IDD5_FXB, and the refresh signal REF are all deactivated, the detection signal generating unit 430 deactivates the mode detection signal REF_BIS to a logic low level. At this point, the deactivation of the self-refresh signal SREF and the refresh signal REF is detected so as to prevent non-toggling of the word line driving information signals FXB<0:7> and the bit line driving signal BISHLB when the self-refresh mode is terminated in a bank active state.

FIGS. 7A and 7B are timing diagrams illustrating an operation of the refresh period detecting unit 410 of FIGS. 5 and 6.

More specifically, FIG. 7A is a timing diagram illustrating the operation of the refresh period detecting unit 410 when the fuse option FS1 is cut.

When the auto-refresh command AREF is inputted, the idle signal IN_RASIDLE is deactivated to a logic low level and the auto-refresh signal AFACT is activated in a pulse shape. Further, the refresh signal REF is activated to a logic high level.

The auto-refresh period detecting unit 422 detects the activation of the auto-refresh signal AFACT, which is internally activated in response to the auto-refresh command AREF, and activates the auto-refresh period detection signal IDD5 to a logic high level. In addition, since the fuse option FS1 is cut, the fuse detecting unit 426 outputs the output control signal FET of a logic low level.

The signal output unit 428 inverts the auto-refresh period detection signal IDD5 in response to the output control signal FET of a logic low level and outputs the auto-refresh mode signal IDD5_FXB of a logic low level.

The refresh detecting unit 432 activates the pre-mode detection signal IDD5_REF to a logic high level in response to the auto-refresh mode signal IDD5_FXB of a logic low level.

The signal generating unit 434 activates the mode detection signal REF_BIS to a logic high level in response to the pre-mode detection signal IDD5_REF of a logic high level.

Thereafter, the level of the mode detection signal REF_BIS is maintained while the auto-refresh operation is performed in response to the plurality of auto-refresh commands.

The active signals ACT<0:3> are activated in a pulse shape in response to the active command ACT.

The auto-refresh period detecting unit 422 deactivates the auto-refresh period detection signal IDD5 to a logic low level in response to the activation of the active signals ACT<0:3>. The signal output unit 428 inverts the auto-refresh period detection signal IDD5 and deactivates the auto-refresh mode signal IDD5_FXB to a logic high level.

The refresh detecting unit 432 deactivates the pre-mode detection signal IDD5_REF to a logic low level in response to the auto-refresh mode signal IDD5_FXB of a logic high level. The signal generating unit 434 deactivates the mode detection signal REF_BIS to a logic low level in response to the pre-mode detection signal IDD5_REF of a logic low level and the refresh signal REF of a logic low level.

Thereafter, the normal mode driving operation is terminated in response to the precharge command PRE.

Then, the refresh signal REF is activated in response to the self-refresh command SREF.

The refresh detecting unit 432 activates the pre-mode detection signal IDD5_REF to a logic high level in response to the self-refresh signal SREF of a logic high level, and the signal generating unit 434 activates the mode detection signal REF_BIS to a logic high level.

FIG. 7B is a timing diagram illustrating an operation of the refresh period detecting unit 410 when the fuse option FS1 is uncut.

When the auto-refresh command AREF is inputted, the idle signal IN_RASIDLE is deactivated to a logic low level and the auto-refresh signal AFACT is activated in a pulse shape. Further, the refresh signal REF is activated to a logic high level.

The auto-refresh period detecting unit 422 detects the activation of the auto-refresh signal AFACT, which is internally activated in response to the auto-refresh command AREF, and activates the auto-refresh period detection signal IDD5 to a logic high level. In addition, since the fuse option FS1 is uncut, the fuse detecting unit 426 outputs the output control signal FET of a logic high level.

Thus, the signal output unit 428 deactivates the auto-refresh mode signal IDD5_FXB to a logic high level, regardless of the logic level of the auto-refresh period detection signal IDD5 in response to the output control signal FET of a logic high level.

The refresh detecting unit 432 deactivates the pre-mode detection signal IDD5_REF to a logic low level in response to the auto-refresh mode signal IDD5_FXB of a logic high level. The signal generating unit 434 deactivates the mode detection signal REF_BIS to a logic low level in response to the pre-mode detection signal IDD5_REF of a logic low level.

When the self-refresh command is inputted, the refresh detecting unit 432 activates the pre-mode detection signal IDD5_REF to a logic high level in response to the self-refresh signal SREF of a logic high level. The signal generating unit 434 activates the mode detection signal REF_BIS to a logic high level in response to the pre-mode detection signal IDD5_REF.

In this way, the refresh period detecting unit 410 generates the mode detection signal REF_BIS indicating the self-refresh mode and the auto-refresh mode in response to the auto-refresh signal AFACT or the self-refresh signal SREF. This is because the refresh detecting unit 432 keeps on activating the pre-mode detection signal IDD5_REF to a logic high level while the auto-refresh command AREF is applied, and deactivates the pre-mode detection signal IDD5_REF to a logic low level when other commands are applied. The refresh detecting unit 432 activates the pre-mode detection signal IDD5_REF even when the self-refresh signal SREF is inputted. Further, the activation of the mode detection signal REF_BIS can be controlled through the fuse option FS1 during the auto-refresh mode, but it is not controlled through the fuse option FS1 during the self-refresh mode.

Figure 8:
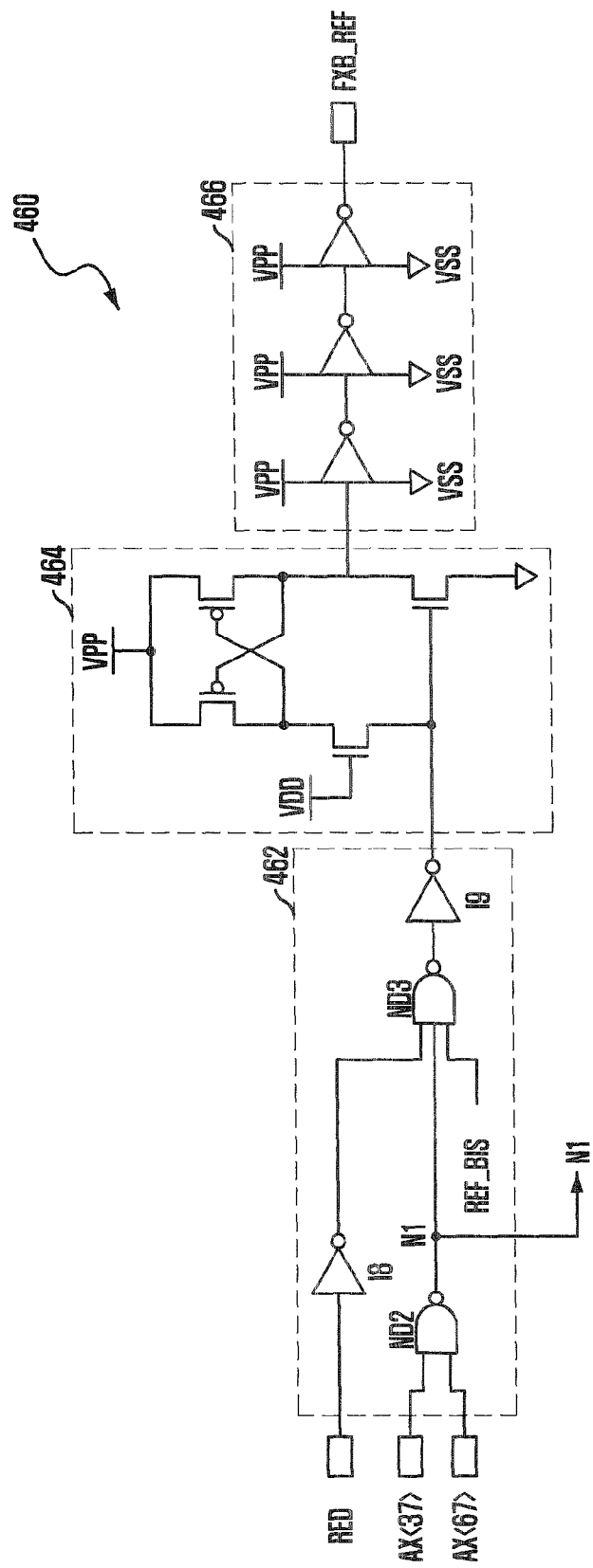
FIG. 8 is a circuit diagram of a first toggle control signal generating unit illustrated in FIG. 4.

FIG. 8 is a circuit diagram of the first toggle control signal generating unit 460 illustrated in FIG. 4.

Referring to FIG. 8, the first toggle control signal generating unit 460 includes an input control unit 462, a level shifting unit 464, and a delay unit 466. The input control unit 462 receives the detective cell repair signal RED and the plurality of address information signals AX<37> and AX<67> in response to the mode detection signal REF_BIS to output an address input signal N1 and an output signal. The level shifting unit 464 inverts the output signal of the input control unit 462 and converts the inverted signal into a high voltage (VPP) level. The delay unit 466 inverts and delays an output signal of the level shifting unit 464 to output the first toggle control signal FXB_REF.

More specifically, the input control unit 462 includes a first NAND gate ND2, a first inverter I8, a second NAND gate ND3, and a second inverter I9. The first NAND gate ND2 is configured to perform a NAND operation on the address information signals AX<37> and AX<67> to output the address input signal N1. The first inverter I8 is configured to invert the detective cell repair signal RED. The second NAND gate ND3 is configured to perform a NAND operation on an output signal of the first NAND gate ND2, an output signal of the first inverter I8, and the mode detection signal REF_BIS. The second inverter I9 is configured to invert an output signal of the second NAND gate ND3.

The delay unit 466 includes odd number of inverters connected in series. Each of the inverters is supplied with a high voltage VPP and a ground voltage VSS as a driving source.

When the address information signals AX<37> and AX<67> have a logic low level, the input control unit 462 outputs the address input signal N1. When the address input signal N1 is outputted and the detective cell repair signal RED has a logic low level, the input control unit 462 activates the output signal to a logic high level in response to the mode detection signal REF_BIS of a logic high level. Then, the level shifting unit 464 inverts the output signal of the input control unit 462 and swings the inverted signal to the high voltage VPP and the ground voltage VSS. The delay unit 466 inverts and delays the output signal of the level shifting unit 464 to activate the first toggle control signal FXB_REF to a logic high level.

That is, the first toggle control signal generating unit 460 activates the first toggle control signal FXB_REF to a logic high level when the address information signals AX<37> and AX<67> have a logic low level in the refresh mode. At this point, the first toggle control signal FXB_REF swings to the high voltage VPP and the ground voltage VSS because of the high voltage VPP used as the driving source of the level shifting unit 464 and the delay unit 466.

Figure 9:
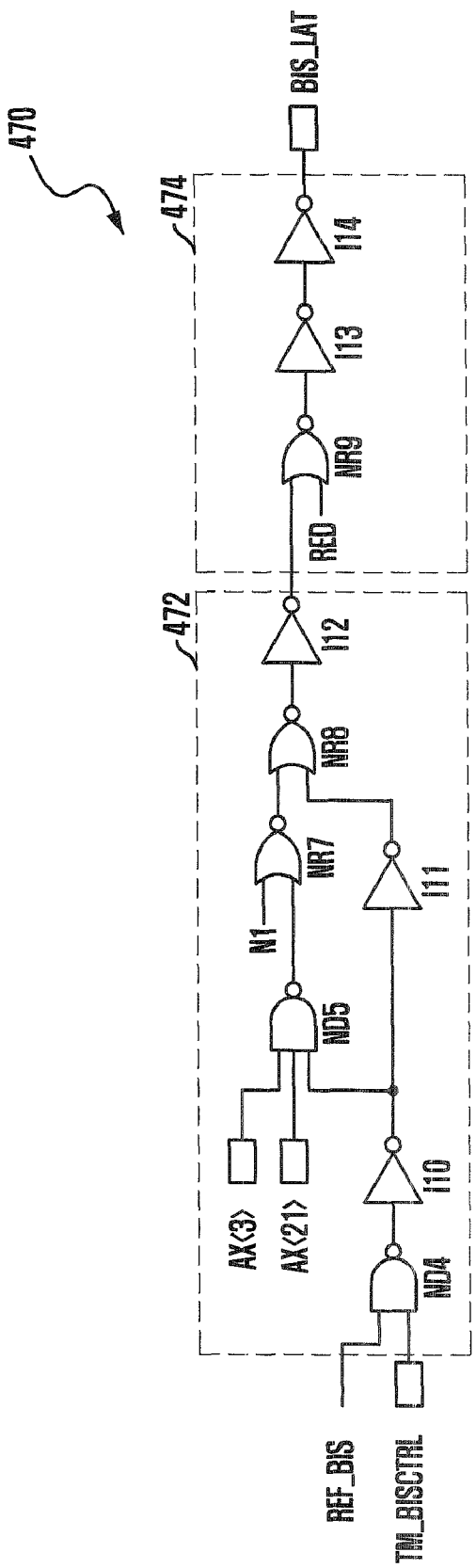
FIG. 9 is a circuit diagram of a second toggle control signal generating unit illustrated in FIG. 4.

FIG. 9 is a circuit diagram of the second toggle control signal generating unit 470 illustrated in FIG. 4.

Referring to FIG. 9, the second toggle control signal generating unit 470 includes an input control unit 472 and a signal generating unit 474. The input control unit 472 receives the address information signals AX<3> and AX<21> and the address input signal N1 in response to the mode detection signal REF_BIS and the test signal TM_BISCTRL. The signal generating unit 474 generates the second toggle control signal BIS_LAT in response to an output signal of the input control unit 472 or the detective cell repair signal RED.

More specifically, the input control unit 472 includes a first NAND gate ND4, a first inverter I10, a second NAND gate ND5, a first NOR gate NR7, a second inverter I11, a second NOR gate NR8, and a third inverter I12. The first NAND gate ND4 is configured to perform a NAND operation on the mode detection signal REF_BIS and the test signal TM_BISCTRL. The first inverter I10 is configured to invert an output signal of the first NAND gate ND4. The second NAND gate ND5 is configured to perform a NAND operation on the address information signals AX<3> and AX<21> and an output signal of the first inverter I10. The first NOR gate NR7 is configured to perform a NOR operation on an output signal of the second NAND gate ND5 and the address input signal N1. The second inverter I11 is configured to invert an output signal of the first inverter I10. The second NOR gate NR8 is configured to perform a NOR operation on an output signal of the second inverter I11 and an output signal of the first NOR gate NR7. The third inverter I12 is configured to invert an output signal of the second NOR gate NR8.

The signal generating unit 474 includes a NOR gate NR9, a first inverter I13, and a second inverter I14. The NOR gate NR9 is configured to perform a NOR operation on the output signal of the input control unit 472 and the defective cell repair signal RED. The first inverter I13 is configured to invert an output signal of the NOR gate NR9. The second inverter I14 is configured to invert an output signal of the first inverter I13 to output the second toggle control signal BIS_LAT.

The input control unit 472 activates its own output signal to a logic low level when the test signal TM_BISCTR, the mode detection signal REF_BIS, and the address input signal N1 have a logic high level and the plurality of address information signals AX<3> and AX<21> have a logic low level. Then, the signal generating unit 474 activates the second toggle control signal BIS_LAT to a logic high level when the output signal of the input control unit 472 has a logic low level and the defective cell repair signal RED has a logic low level.

In other words, when the test signal TM_BISCTRL and the mode detection signal REF_BIS are activated, the second toggle control signal generating unit 470 activates the second toggle control signal BIS_LAT according to the address information signals AX<3> and AX<21> and the address input signal N1.

Figure 10:
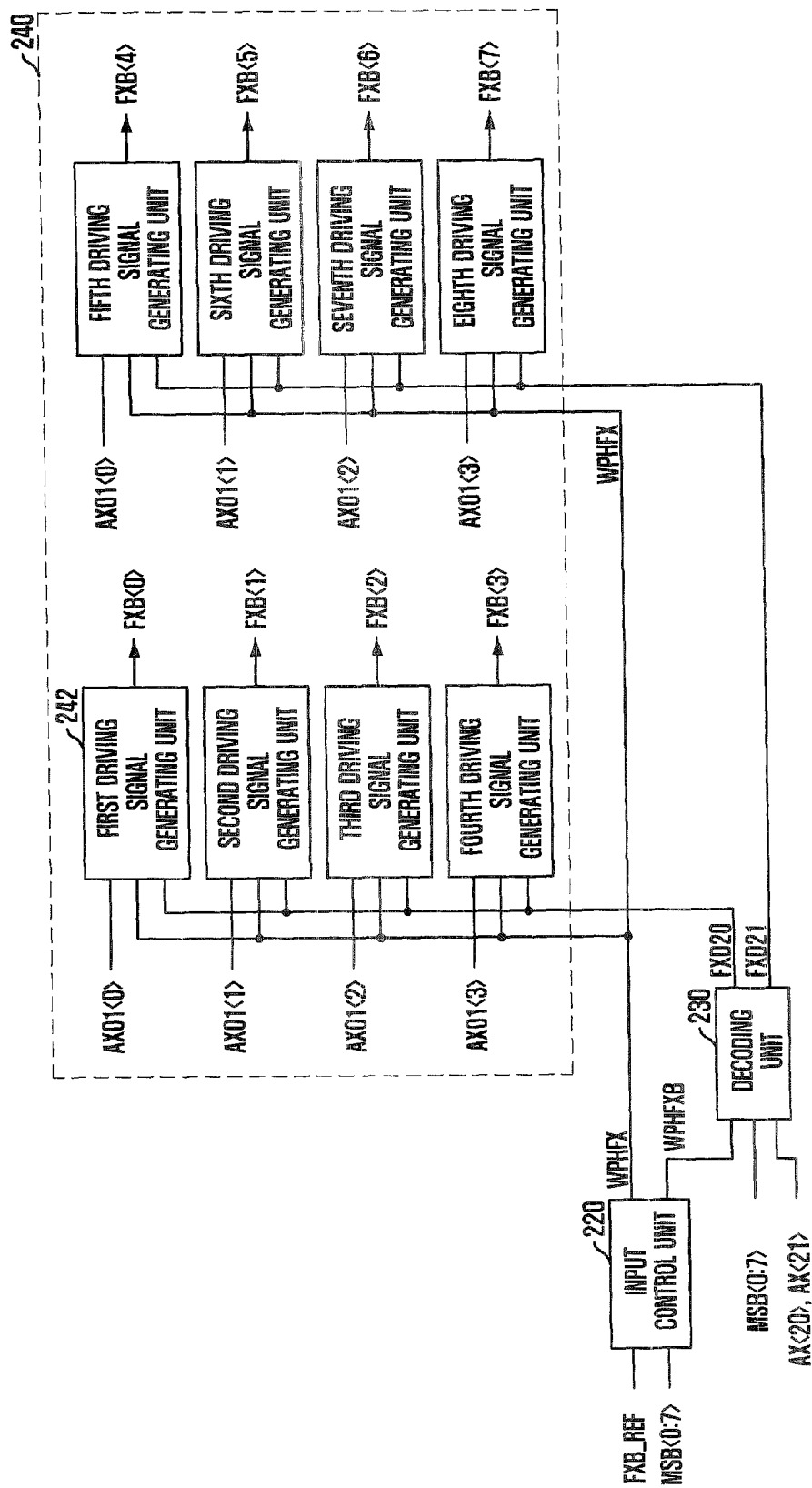
FIG. 10 is a block diagram of a word line driving control unit illustrated in FIG. 4.

FIG. 10 is a block diagram of the word line driving control unit 210 illustrated in FIG. 4.

Referring to FIG. 10, the word line driving control unit 210 includes an input control unit 220, a decoding unit 230, and a driving signal generating unit 240. The input control unit 220 receives the address information signals MSB<0:7> in response to the first toggle control signal FXB_REF. The decoding unit 230 decodes the address information signals MSB<0:7>, AX<20> and AX<21> in response to an input control bar signal WPHFXB outputted from the input control unit 220 to output first and second decoding signals FXD20 and FXD21. The driving signal generating unit 240 outputs the address information signals AX01<0:3> as the word line driving information signals FXB<0:7> corresponding to the first and second decoding signals FXD20 and FXD21 in response to an input control signal WPHFX outputted from the input control unit 220.

The respective blocks are provided in plurality according to the corresponding address information signals MSB<0:7>. Only a case of the address information signal MSB<0> will be described herein.

Figure 11:
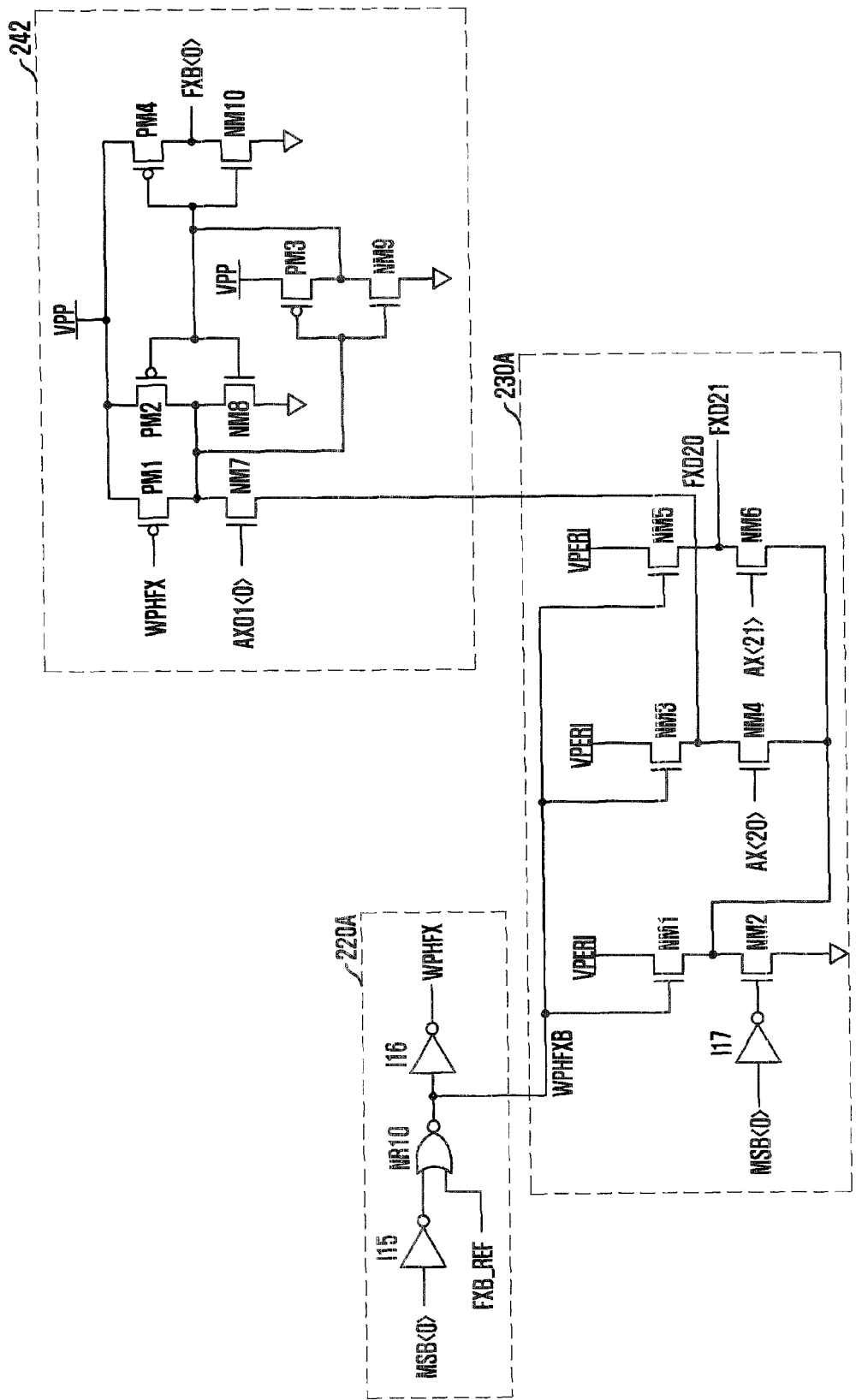
FIG. 11 is a circuit diagram of an input control unit, a decoding unit, and a first driving signal generating unit illustrated in FIG. 10.

FIG. 11 is a circuit diagram of an input control unit 220A, a decoding unit 230A, and a first driving signal generating unit 242.

Referring to FIG. 11, the input control unit 220A includes a first inverter I15, a NOR gate NR10, and a second inverter I16. The first inverter I15 is configured to invert the address information signal MSB<0>. The NOR gate NR10 is configured to perform a NOR operation on the first toggle control signal FXB_REF and an output signal of the first inverter I10 to output the input control bar signal WPHFXB. The second inverter I16 is configured to invert the input control bar signal WPHFXB to output the input control signal WPHFX.

In the decoding unit 230A, an inverter I17 is configured to invert the address information signal MSB<0>. A first NMOS transistor NM1 has a gate receiving the input control bar signal WPHFXB and a drain connected to a peripheral voltage (VPERI) terminal. A second NMOS transistor NM2 has a gate receiving an output signal of the inverter I17, a drain connected to a source of the first NMOS transistor NM1, and a source connected to a ground voltage (VSS) terminal. A third NMOS transistor NM3 has a gate receiving the input control bar signal WPHFXB and a drain connected to the VPERI terminal. A fourth NMOS transistor NM4 has a gate receiving the address information signal AX<20>, a drain connected to a source of the third NMOS transistor NM3, and a source connected to a connection node between the first NMOS transistor NM1 and the second NMOS transistor NM2. A fifth NMOS transistor NM5 has a gate receiving the input control bar signal WPHFXB and a drain connected to the VPERI terminal. A sixth NMOS transistor NM6 has a gate receiving the address information signal AX<21>, a drain connected to a source of the fifth NMOS transistor NM5, and a source connected to a connection node between the first NMOS transistor NM1 and the second NMOS transistor NM2. A voltage applied to a connection node between the third NMOS transistor NM3 and the fourth NMOS transistor NM4 is outputted as the first decoding signal FXD20, and a voltage applied to a connection node between the NMOS fifth transistor NM5 and the sixth NMOS transistor NM6 is outputted as the second decoding signal FXD21.

In the first driving signal generating unit 242, a first PMOS transistor PM1 has a gate receiving the input control signal WPHEX and a source connected to a high voltage (VPP) terminal. A first NMOS transistor NM7 has a gate receiving the address information signal AX01<0>, a drain connected to a drain of the first PMOS transistor PM1, and a source receiving the first decoding signal FXD20. A second PMOS transistor PM3 and a second NMOS transistor NM9 are serially connected between the VPP terminal and the VSS terminal and have a gate receiving a voltage applied to a connection node between the first PMOS transistor PM1 and the first NMOS transistor NM7. A third PMOS transistor PM2 and a third NMOS transistor NM8 are serially connected between the VPP terminal and the VSS terminal and have a gate receiving a voltage applied to a connection node between the second PMOS transistor PM3 and the second NMOS transistor NM9. A fourth PMOS transistor PM4 and a fourth NMOS transistor NM10 are serially connected between the VPP terminal and the VSS terminal and have a gate receiving a voltage applied to a connection node between the second PMOS transistor PM3 and the second NMOS transistor NM9. The connection node between the first PMOS transistor PM1 and the first NMOS transistor NM7 is coupled to the connection node between the third PMOS transistor PM2 and the third NMOS transistor NM8, and the voltage applied to the connection node between the fourth PMOS transistor PM4 and the fourth NMOS transistor NM10 is outputted as the word line driving information signal FXB<0>.

An operation of the word line driving control unit 210 illustrated in FIG. 11 will be described below.

When the first toggle control signal FXB_REF is deactivated to a logic low level, the input control unit 220A delays the address information signal MSB<0> to output the input control bar signal WPHFXB, and inverts the address information signal MSB<0> to output the input control signal WPHFX. When the first toggle control signal FXB_REF is activated to a logic high level, the input control unit 220A outputs the input control bar signal WPHFXB of a logic low level and the control input signal WPHFX of a logic high level, regardless of the logic level of the address information signal MSB<0>.

The decoding unit 230A outputs the first and second decoding signals FXD20 and FXD21 by decoding the address information signals MSB<0>, AX<20> and AX<21> only when the input control bar signal WPHFXB has a logic high level. When the input control bar signal WPHFXB has a logic low level, the first and second decoding signals FXD20 and FXD21 are not outputted.

The first driving signal generating unit 242 activates the word line driving information signal FXB<0> corresponding to the address information signal AX01<0> and the first decoding signal FXD20 only when the input control signal WPHFX has a logic low level. When the input control signal WPHFX has a logic high level, the word line driving information signal FXB<0> maintains and outputs a previous logic level.

In other words, when the first toggle control signal FXB_REF is activated to a logic high level, the word line driving control unit 210 of FIGS. 10 and 11 maintains the word line information signal FXB<0:7> at a previous logic level without toggling, regardless of the logic level of the address information signals MSB<0:7>, AX<20>, AX<21> and AX01<0:3>.

On the other hand, when the first toggle control signal FXB_REF is deactivated to a logic low level, the word line driving control unit 210 activates the word line information signals FXB<0:7> corresponding to the address information signals MSB<0:7>, AX<20>, AX<21> and AX01<0:3>.

Figure 12:
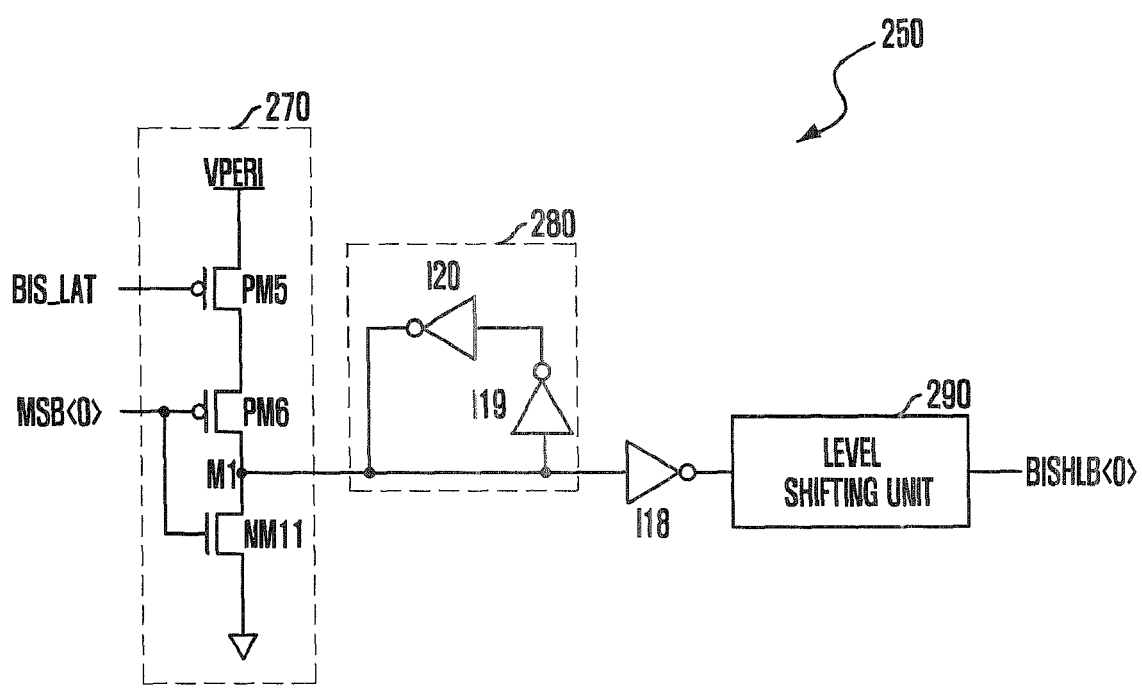
FIG. 12 is a circuit diagram of a bit line driving control unit illustrated in FIG. 4.

FIG. 12 is a circuit diagram of the bit line driving control unit 250 illustrated in FIG. 4.

Referring to FIG. 12, the bit line driving control unit 250 includes an input control unit 270, a latch unit 280, an inverter I18, and a level shifting unit 290. The input control unit 270 is configured to invert the address information signal MSB<0> in response to the second toggle control signal BIS_LAT. The latch unit 280 is configured to latch an output signal of the input control unit 270. The inverter I18 is configured to invert the output signal of the latch unit 280, and the level shifting unit 290 is configured to shift the level of an output signal of the inverter I18 to output the bit line driving signal BISHLB.

In the input control unit 270, a first PMOS transistor PM5 has a gate receiving the second toggle control signal BIS_LAT and a source connected to the VPERI terminal. A second PMOS transistor PM6 has a gate receiving the address information signal MSB<0>, a source connected to a drain of the first PMOS transistor PM5, and a drain connected to a node M1. An NMOS transistor NM11 has a gate receiving the address information signal MSB<0>, a drain connected to the node M1, and a source connected to the VSS terminal.

The latch unit 280 includes an inverter I19 configured to invert a voltage applied to the node M1, and an inverter I20 configured to invert an output signal of the inverter I19 and apply the inverted signal to the node M1.

When the second toggle control signal BIS_LAT is deactivated to a logic low level, the input control unit 270 inverts the address information signal MSB<0>. The latch unit 280 maintains the voltage applied to the node M1 and the bit line driving signal BISHLB is outputted through the inverter I18 and the level shifting unit 290.

When the second toggle control signal BIS_LAT is activated to a logic high level, the address information signal MSB<0> is not outputted. Therefore, the voltage applied to the node M1, which was previously maintained by the latch unit 280, is outputted as the bit line driving signal BISHLB through the inverter I18 and the level shifting unit 290.

That is, when the second toggle control signal BIS_LAT is deactivated, the bit line driving control unit 250 outputs the bit line driving signal BISHLB corresponding to the logic level of the address information signal MSB<0>. When the second toggle control signal BIS_LAT is activated, the bit line control unit 250 outputs the bit line driving signal BISHLB of a previous level, regardless of the logic level of the address information signal MSB<0>.

The bit line driving control units 250 is provided for each bit of the address information signal MSB<0:7>. Since the bit line driving control units have the same circuit configuration, the case of the address information signal MSB<0> will be described as an example.

Figure 13A:
FIG. 13A is a circuit diagram of a sub hole illustrated in FIG. 4.

FIG. 13A is a circuit diagram of the sub hole 320 illustrated in FIG. 4.

Referring to FIG. 13A, the sub hole 320 includes a driving signal generating unit 322 and a separation signal generating unit 324. The driving signal generating unit 322 inverts the word line driving information signal FXB<0> and generate the word line driving information signal FX<0> and the word line driving information bar signal FXB<0>. The separation signal generating unit 324 inverts the bit line driving signal BISHLB to generate the bit line separation signal BISHL.

Figure 1:
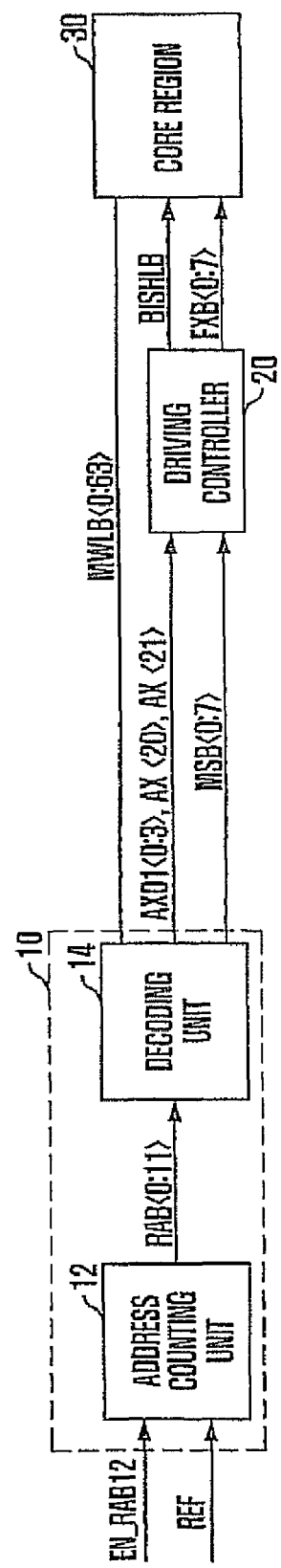
FIG. 1 is a block diagram of a conventional semiconductor memory device with an address counting block for a refresh mode.
Figure 2:
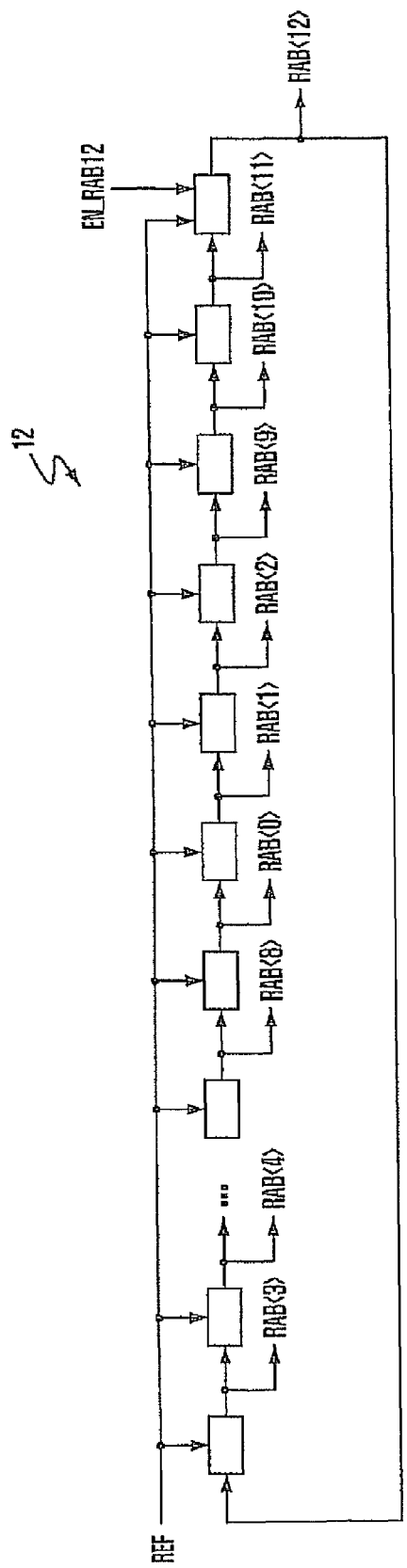
FIG. 2 is a circuit diagram of an address counting unit illustrated in FIG. 1.
Figure 3:
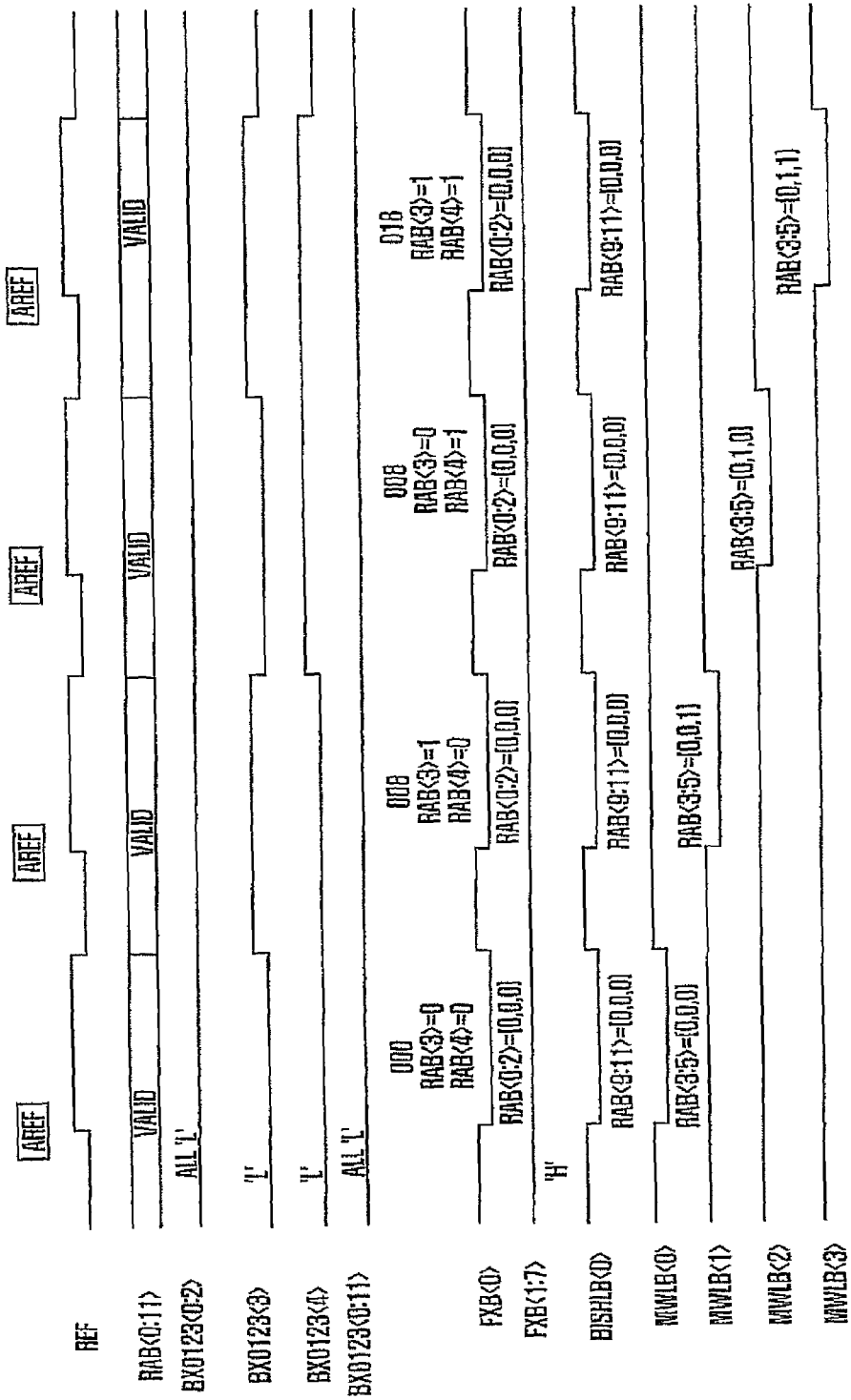
FIG. 3 is a timing diagram illustrating the operation of the conventional semiconductor memory device of FIGS. 1 and 2.

In the driving signal generating unit 322 and the separation signal generating unit 324 of FIG. 13A, 1 bit of the corresponding input signal is illustrated as an example.

Figure 13B:
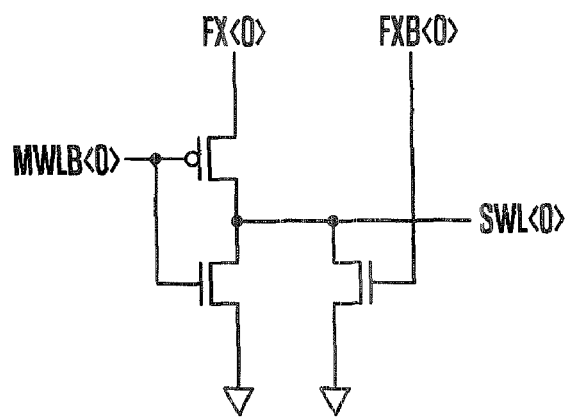
FIG. 13B is a circuit diagram of a sub word line driving unit illustrated in FIG. 4.

FIG. 13B is a circuit diagram of the sub word line driving unit 340 illustrated in FIG. 4.

Referring to FIG. 13B, the sub word line driving unit 340 includes a plurality of drivers for outputting the sub word line driving signal SWL<0> using the word line driving information signals FXB<0> and FX<0> in response to the word line driving information signal MWLB<0>.

In the sub word line driving unit 340 of FIG. 13B, 1 bit of the word line driving information signal MWLB<0> is illustrated as an example.

FIGS. 14A and 14B are timing diagrams of signals used in the word line driving control unit and the bit line driving control unit of FIGS. 10 to 12.

A level variation of the first and second toggle control signals according to the counting of the internal address is illustrated in FIG. 14A.

When the internal addresses RAB<0:11> are decoded, three bits RAB<0:2> generate the word line driving information signals FXB<0:7>, and next six bits RAB<3:8> generate the word line driving information signals MWLB<0:63> for selecting the word lines within the block. The remaining three bits RAB<9:11> generate signals for selecting the block within the bank.

The counting order of the internal addresses is as follows: RAB<3>→RAB<4>→RAB<5>→RAB<6>→RAB<7>→RAB<8>→RAB<0>→RAB<1>→RAB<2>→RAB<9>→RAB<10>→RAB<11>.

Referring to FIG. 14A, the internal addresses RAB<0:2> and RAB<9:11> have a value of "000" until the internal addresses RAB<3:8> are sequentially counted and thus have a value of "111". During this period, the first and second toggle control signals FXB_REF and BIS_LAT are activated to a logic high level, so that the word line driving information signals FXB<0:7> and the bit line driving signal BISHLB generated by decoding the internal addresses RAB<0:2> and RAB<9:11> cannot be toggled.

Thereafter, when the internal addresses RAB<3:8> have a value of "111" and the internal addresses RAB<0:2> have a value of "000", the first toggle control signal FXB_REF is deactivated to a logic low level and the second toggle control signal BIS_LAT is maintained at a logic high level. This is maintained during the auto-refresh mode or the self-refresh mode. Therefore, the word line driving information signals FXB<0:7> are toggled to have the logic levels corresponding to the internal addresses RAB<0:2> by the deactivation of the first toggle control signal FXB_REF. And then, the logic levels of the word line driving information signals FXB<0:7> are maintained, until the internal addresses RAB<3:8> are again counted and the value of the internal addresses RAB<0:2> is changed. That is, whenever the value of the internal addresses RAB<0:2> is changed, the first toggle control signal FXB_REF is deactivated and the changed value of the internal addresses RAB<0:2> is applied.

The first and second toggle control signals FXB_REF and BIS_LAT are deactivated to a logic low level during the auto-refresh mode or the self-refresh mode, when the internal addresses RAB<3:8> has a value of "111", the internal addresses RAB<0:2> has a value of "111", and the internal addresses RAB<9:11> has a value of "000". Thus, the bit line driving signal BISHLB is toggled to have logic levels corresponding to the internal addresses RAB<9:11> by the deactivation of the second toggle control signal BIS_LAT. Further, the word line driving information signals FXB<0:7> are toggled to have logic levels corresponding to the internal addresses RAB<0:2> by the deactivation of the first toggle control signal FXB_REF. That is, whenever the values of the internal addresses RAB<0:2> and RAB<9:11> are changed, the first and second toggle control signals FXB_REF and BIS_LAT are deactivated and the changed values of the internal addresses RAB<0:2> and RAB<9:11> are applied.

In other words, the values of the internal addresses RAB<0:2> and RAB<9:11> are not changed while the internal addresses RAB<3:8> are counted. Thus, the word line driving information signals FXB<0:7> and the bit line driving signal BISHLB generated by the internal addresses RAB<0:2> and RAB<9:11> are controlled not to be toggled by the first and second toggle control signals FXB_REF and BIS_LAT.

FIG. 14B is a timing diagram illustrating the level variation of the internal addresses and the deactivation of the first and second toggle control signals FXB_REF and BIS_LAT.

Referring to FIG. 14B, the first and second toggle control signals FXB_REF and BIS_LAT are deactivated to a logic low level. Thus, whenever the internal addresses RAB<3:8>, RAB<0:2> and RAB<9:11> change, the word line driving information signals MWLB<0:63> and FXB<0:7> and the bit line driving signal BISHLB are toggled.

The variation of the signals in each bit according to the counting of the internal addresses will be described below in detail.

Figure 15:
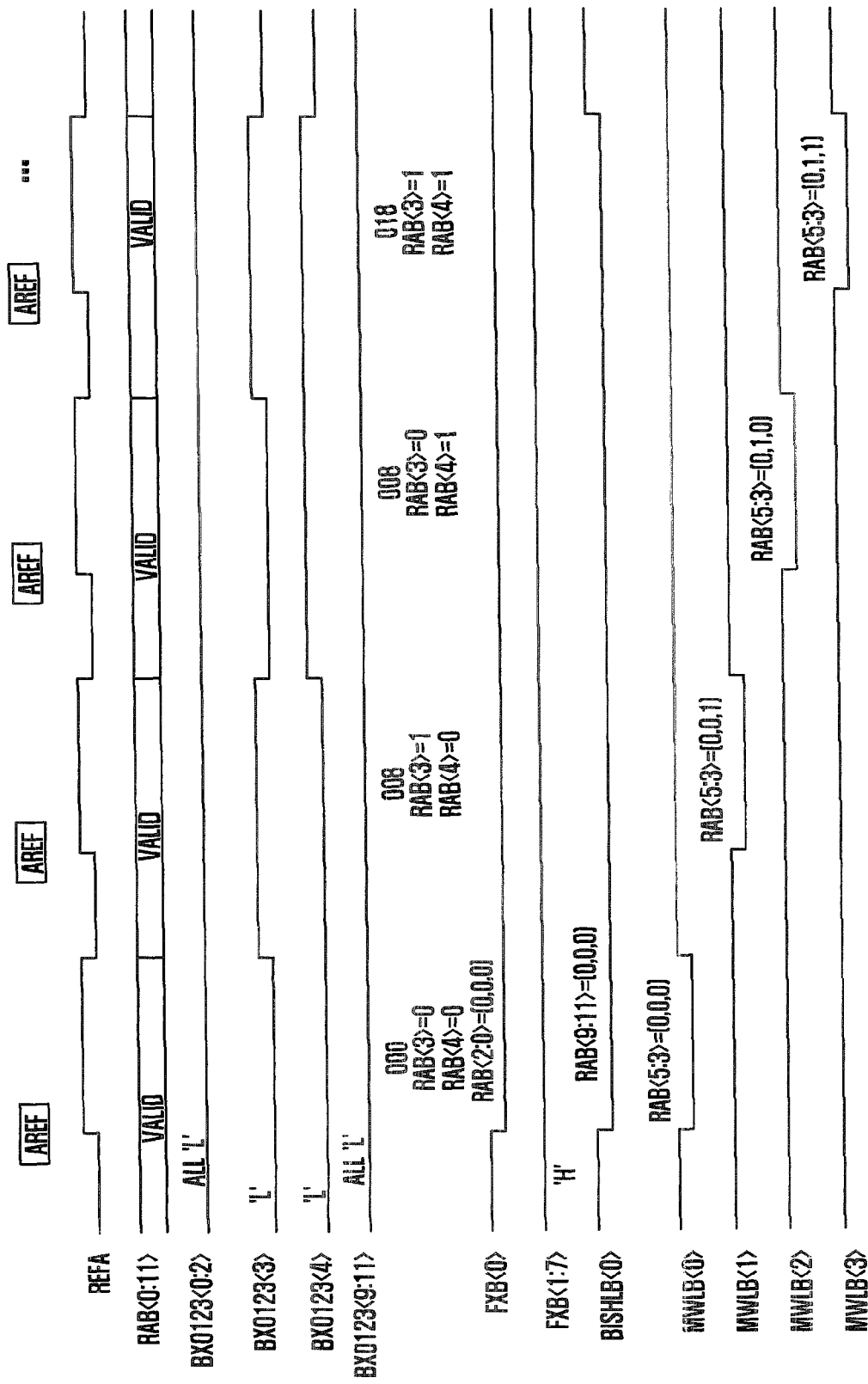
FIG. 15 is a timing diagram illustrating an operation of the semiconductor memory device in accordance with the present invention.

FIG. 15 is a timing diagram illustrating an operation of the semiconductor memory device in accordance with the present invention. Specifically, the level variation of the word line driving information signals MWLB<0:63> and FXB<0:7> and the bit line driving signal BISHLB<0> according to the counting of the internal addresses RAB<0:11> will be described with reference to FIG. 15.

Referring to FIG. 15, whenever the auto-refresh command AREF is inputted, the internal addresses RAB<3:5> are sequentially counted 1 bit by 1 bit and their values are increased. The word line driving information signals generated by decoding the internal addresses RAB<3:5> are activated in order of MWLB<0>→MWLB<1>→MWLB<2>→MWLB<3>.

However, since the values of the internal addresses RAB<0:2> and RAB<9:11> are not changed, the word line driving information signals FXB<0:7> and the bit line driving signal BISHLB<0> generated by decoding the internal addresses RAB<0:2> and RAB<9:11> are controlled to maintain the constant values.

Therefore, when the addresses are sequentially activated during the auto-refresh mode or the self-refresh mode, it is possible to prevent the toggling of the signals generated by the internal addresses whose values are not changed during the predetermined period.

In other words, the auto-refresh period is defined by activating the auto-refresh period detection signal IDD5 when the auto-refresh command is inputted and by deactivating it when the active signals ACT<0:3> are inputted. When the values of the internal addresses are not changed during the defined auto-refresh mode, the toggling of the signals generated by the corresponding internal addresses can be prevented. Therefore, the toggling generated in a prior art whenever the auto-refresh command is inputted is permitted only when necessary, thereby reducing the current consumption of the semiconductor memory device.

Further, the control of the toggling during the auto-refresh mode can selected using the fuse option.

When some bits of the internal addresses maintain constant values during the auto-refresh mode or the self-refresh mode, the toggling of the internal signals generated thereby can be selectively permitted, thereby reducing the current consumption caused by unnecessary toggling.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
an internal address generator configured to generate a plurality of first word line driving information signals and a plurality of first to seventh address information signals, sequentially activated in response to a driving signal and a refresh signal;
a toggle controller configured to generate first and second toggle control signals in response to the third to sixth address information signals during an auto-refresh mode or a self-refresh mode;
a driving controller configured to generate a plurality of bit line driving signals and a plurality of second word line driving information signals corresponding to the first to third and seventh address information signals in response to the first and second toggle control signals; and a core region configured to access cells in response to the bit line driving signals and the first and second word line driving information signals.

2. The semiconductor memory device as recited in claim 1, wherein the toggle controller includes:
   a refresh period detecting unit configured to generate a mode detection signal indicating that a refresh mode is the auto-refresh mode or the self-refresh mode, the auto-refresh mode being defined by an auto-refresh signal and a plurality of active signals, and the self-refresh mode being defined by a self-refresh signal and the refresh signal; and
   a toggle control signal generating unit configured to receive the third to sixth address information signals in response to the mode detection signal and a test signal to generate the first and second toggle control signals.

3. The semiconductor memory device as recited in claim 2, wherein the refresh period detecting unit includes:
   an auto-refresh detecting unit configured to receive the auto-refresh signal, the active signals, and an idle signal to generate an auto-refresh mode signal indicating the auto-refresh mode; and
   a detection signal generating unit configured to receive the auto-refresh mode signal, the self-refresh signal, and the refresh signal to generate the mode detection signal indicating the refresh mode.

4. The semiconductor memory device as recited in claim 3, wherein the toggle control signal generating unit includes:
   a first toggle control signal generating unit configured to receive the fourth and fifth address information signals during an activation of the mode detection signal to generate the first toggle control signal; and
   a second toggle control signal generating unit configured to receive the third and sixth address information signals in response to the mode detection signal, the test signal, and a defective cell repair signal to generate the second toggle control signal.

5. The semiconductor memory device as recited in claim 4, wherein the driving controller includes:
   a word line driving control unit configured to receive the first to third and seventh address information signals to generate the plurality of second word line driving information signals in response to the first toggle control signal; and
   a bit line driving control unit configured to receive the seventh address information signal to generate the plurality of bit line driving signals in response to the second toggle control signal.

6. The semiconductor memory device as recited in claim 5, wherein the auto-refresh detecting unit includes:
   an auto-refresh period detecting unit configured to generate an auto-refresh period detection signal, activated in response to the auto-refresh signal and deactivated in response to the plurality of active signals;
   a fuse detecting unit configured to generate an output control signal according to a fuse option; and
   a signal output unit configured to output the auto-refresh period detection signal as the auto-refresh mode signal in response to the output control signal.

7. The semiconductor memory device as recited in claim 6, wherein the signal output unit includes:
   a first inverter configured to invert the output control signal;
   a NAND gate configured to perform a NAND operation on an output signal of the first inverter and the auto-refresh period detection signal; and
   a first delay configured to delay an output signal of the NAND gate to output the auto-refresh mode signal.

8. The semiconductor memory device as recited in claim 7, wherein the fuse detecting unit includes:
   a fuse option connected between a power supply voltage terminal and a first node;
   a second inverter configured to invert a voltage applied to the first node;
   an NMOS transistor having a gate receiving an output signal of the second inverter, a drain connected to the first node, and a source connected to a ground voltage terminal; and
   a second delay configured to delay the output signal of the second inverter to output the output control signal.

9. The semiconductor memory device as recited in claim 8, wherein the auto-refresh detecting unit further includes an idle detecting unit configured to receive the auto-refresh period detection signal and the idle signal to generate an idle detection signal indicating an idle period.

10. The semiconductor memory device as recited in claim 9, wherein the idle detecting unit includes:
    a first NOR gate configured to perform a NOR operation on the auto-refresh period detection signal and the idle signal; and
    a third inverter configured to invert an output signal of the first NOR gate to output the idle detection signal.

11. The semiconductor memory device as recited in claim 6, wherein the detection signal generating unit includes:
    a refresh detecting unit configured to output a pre-mode detection signal in response to the activation of the auto-refresh mode signal or the self-refresh signal; and
    a first signal generating unit configured to receive the pre-mode detection signal and the refresh signal to generate the mode detection signal indicating the refresh mode.

12. The semiconductor memory device as recited in claim 11, wherein the first toggle control signal generating unit includes:
    a first input control unit configured to receive the defective cell repair signal and the fourth and fifth address information signals in response to the mode detection signal to output an address input signal and an output signal;
    a first level shifting unit configured to invert the output signal of the first input control unit and convert the inverted output signal into a high voltage level; and
    a first delay configured to invert and delay an output signal of the first level shifting unit to output the first toggle control signal.

13. The semiconductor memory device as recited in claim 12, wherein the second toggle control signal generating unit includes:
    a second input control unit configured to receive the third and sixth address information signals and the address input signal in response to the mode detection signal and the test signal; and
    a second signal generating unit configured to generate the second toggle control signal in response to an output signal of the second input control unit or the defective cell repair signal.

14. The semiconductor memory device as recited in claim 13, wherein the auto-refresh period detecting unit includes:
    a set signal input unit configured to receive a reset signal and the auto-refresh signal to output an input set signal;
    a reset signal input unit configured to receive the plurality of active signals to output first and second input reset signals; and
    a first RS latch unit configured to activate the auto-refresh period detection signal in response to the input set signal and deactivate the auto-refresh period detection signal in response to the first and second input reset signals.

15. The semiconductor memory device as recited in claim 14, wherein the refresh detecting unit includes:
   a first inverter configured to invert the auto-refresh mode signal;
   a first NOR gate configured to perform a NOR operation on the self-refresh signal and an output signal of the first inverter; and
   a second inverter configured to invert an output signal of the first NOR gate to output the pre-mode detection signal.

16. The semiconductor memory device as recited in claim 15, wherein the core region includes:
   a sub hole configured to receive the second word line driving information signal to generate a second word line driving information bar signal, and to receive the plurality of bit line driving signals to generate a plurality of bit line separation signals;
   a sub word line driving unit configured to generate a plurality of sub word line driving signals in response to the second word line driving information signal, the second word line driving information bar signal, and the first word line driving information signal;
   a cell mat configured to read or store data of cells corresponding to the sub word line driving signal; and
   a bit line sense amplifier block configured to sense and amplify data of the corresponding cell mat in response to the plurality of bit line separation signals,
   wherein the sub hole, the sub word line driving unit, the cell mat, and the bit line sense amplifier block are provided in an array form.

17. The semiconductor memory device as recited in claim 14, wherein the set signal input unit includes a first NOR gate configured to perform a NOR operation on the reset signal and the auto-refresh signal to output the input set signal.

18. The semiconductor memory device as recited in claim 17, wherein the reset signal input unit includes:
   a second NOR gate configured to perform a NOR operation on the first and second active signals to output the first input reset signal; and
   a third NOR gate configured to perform a NOR operation on the third and fourth active signals to output the second input reset signal.

19. The semiconductor memory device as recited in claim 14, wherein the word line driving control unit includes:
   a third input control unit configured to receive the seventh address information signal to output an input control signal and an input control bar signal in response to the first toggle control signal;
   a decoding unit configured to decode the second, third and seventh address information signals to output first and second decoding signals in response to the input control bar signal; and
   a driving signal generating unit configured to activate the second word line driving information signal corresponding to the first address information signal and the first and second decoding signal in response to the input control signal.

20. The semiconductor memory device as recited in claim 19, wherein the bit line driving control unit includes:
   a fourth input control unit configured to invert the seventh address information signal in response to the second toggle control signal;
   a latch unit configured to latch an output signal of the fourth input control unit;
   an inverter configured to invert an output signal of the fourth input control unit; and
   a second level shifting unit configured to shift a level of an output signal of the inverter to output the plurality of bit line driving signals.

21. The semiconductor memory device as recited in claim 5, wherein the auto-refresh detecting unit includes:
   an auto-refresh period detecting unit configured to generate an auto-refresh period detection signal, activated in response to the auto-refresh signal and deactivated in response to the plurality of active signals; and
   a signal output unit configured to invert the auto-refresh period detection signal to output the auto-refresh mode signal.

22. The semiconductor memory device as recited in claim 21, wherein the signal output unit includes:
   a NAND gate configured to perform a NAND operation on the auto-refresh period detection signal and a power supply voltage; and
   a delay configured to delay an output signal of the NAND gate to output the auto-refresh mode signal.

23. A method for driving a semiconductor memory device, comprising:
   sequentially increasing a first group of bits of an internal address in an auto-refresh mode;
   maintaining an internal driving signal generated by a second group of bits of the internal address, not including bits of the first group, at a constant level, when the second group of bits of the internal address has a constant value; and
   generating a word line driving information signal and a bit line driving signal by decoding the increased internal address.

24. The method as recited in claim 23, wherein the semiconductor memory device enters the auto-refresh mode when an auto-refresh command is inputted, and exits the auto-refresh mode when a normal active command is inputted.

* * * * *